(12) United States Patent
Chang

(10) Patent No.: US 11,300,880 B2
(45) Date of Patent: Apr. 12, 2022

(54) COATING SYSTEM AND CALIBRATION METHOD THEREOF

(71) Applicant: NANYA TECHNOLOGY CORPORATION, New Taipei (TW)

(72) Inventor: Sheng-Kai Chang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 372 days.

(21) Appl. No.: 16/706,860

(22) Filed: Dec. 9, 2019

(65) Prior Publication Data

US 2021/0173305 A1 Jun. 10, 2021

(51) Int. Cl.
*B25B 27/14* (2006.01)
*G03F 7/16* (2006.01)
*H01L 21/687* (2006.01)
*H01L 21/683* (2006.01)

(52) U.S. Cl.
CPC ............ *G03F 7/16* (2013.01); *H01L 21/6838* (2013.01); *H01L 21/68735* (2013.01); *H01L 21/68742* (2013.01)

(58) Field of Classification Search
CPC . G03F 7/16; H01L 21/6838; H01L 21/68735; H01L 21/68742; H01L 21/6715
USPC .............................................. 29/281.4, 281.1
See application file for complete search history.

(56) References Cited

U.S. PATENT DOCUMENTS

| 6,032,512 A * | 3/2000 | Li ............................ H01L 21/68 73/1.79 |
| 6,120,609 A * | 9/2000 | Selyutin ............ H01L 21/68742 118/500 |
| 2015/0303091 A1* | 10/2015 | Ruda Y Witt .... H01L 21/68785 414/784 |

FOREIGN PATENT DOCUMENTS

| TW | 376201 | 12/1999 |
| TW | 201401422 A | 1/2014 |

* cited by examiner

*Primary Examiner* — Joseph J Hail
*Assistant Examiner* — Shantese L McDonald
(74) *Attorney, Agent, or Firm* — CKC & Partners Co., LLC

(57) ABSTRACT

A coating system includes supporting pins, a suction plane, and a calibrating disk. The suction plane is located between the supporting pins, and the calibrating disk is configured to dispose on the supporting pins or the suction plane. The calibrating disk includes a round top surface and a round bottom surface being opposite to the round top surface. The round bottom surface has a round plane and a dependable wall surrounding the round plane, and an edge of the round plane and an edge of the round bottom surface are concentric. The dependable wall is configured to limited horizontal movement of the supporting pins, and the round plane is configured to cover the suction plane. A calibration method of the coating system is also provided.

12 Claims, 4 Drawing Sheets

COATING SYSTEM AND CALIBRATION METHOD THEREOF

BACKGROUND

Field of Invention

The present invention relates to a semiconductor device fabricating system and a calibration method thereof. More particularly, the present invention relates to a coating system and a calibration method thereof.

Description of Related Art

Photolithography uses light to transfer a geometric pattern from a photomask to a photosensitive compound on the substrate. A series of chemical treatments then either etches the exposure pattern into the material or enables deposition of a new material in the desired pattern upon the material underneath the photoresist. In complex integrated circuits, photolithography is one of the main techniques for fabricating semiconductor device.

Before removing parts of the photoresist with developer after optical exposure, forming a photoresist layer on a substrate can be performed in a coating system. However, in a coating process, bumping and scratching during movement and rotation may leave wounds on the substrate, and the wounds may cause defects in continued processes such as developing, decreasing the yield of the semiconductor devices.

SUMMARY

The present disclosure relates in general to a coating system and a calibration method thereof.

According to an embodiment of the present disclosure, a coating system includes supporting pins, a suction plane, and a calibrating disk. The suction plane is located between the supporting pins, and the calibrating disk is configured to dispose on the supporting pins or the suction plane. The calibrating disk includes a round top surface and a round bottom surface being opposite to the round top surface. The round bottom surface has a round plane and a dependable wall surrounding the round plane, and an edge of the round plane and an edge of the round bottom surface are concentric. The dependable wall is configured to limited horizontal movement of the supporting pins, and the round plane is configured to cover the suction plane.

In an embodiment of the present disclosure, the supporting pins have tips, and tips of the supporting pins are configured to move between a support position and a retrieve position. The support position is located above the suction plane, and the retrieve position is located under the suction plane.

In an embodiment of the present disclosure, the supporting pins and the suction plane are configured to hold a wafer, and a diameter of the wafer and a diameter of the edge of the round top surface are the same.

In an embodiment of the present disclosure, a diameter of the round top surface is in a range from 298 mm to 300 mm.

In an embodiment of the present disclosure, a diameter of the round plane is in a range from 170 mm to 180 mm.

In an embodiment of the present disclosure, a material of the calibrating disk includes glass or metal.

In an embodiment of the present disclosure, the round bottom surface includes a bottom ring-shaped plane surrounding the round plane. The round plane is located downward from the bottom ring-shaped plane, and the dependable wall connects the round plane to the bottom ring-shaped plane.

In an embodiment of the present disclosure, a depth of the round plane is in a range from 1 mm to 2 mm from the bottom ring-shaped plane.

In an embodiment of the present disclosure, the calibrating disk further includes a round substrate and a donut substrate. The round substrate has the round plane, and the donut substrate has a top ring-shaped plane, a bottom ring-shaped plane being opposite to the top ring-shaped plane, and a central hole. The round substrate is connected to the top ring-shaped plane of the donut substrate and covering opening of the central hole on the top ring-shaped plane. The round plane is located downward from the bottom ring-shaped plane and being accessible through the central hole.

According to an embodiment of the present disclosure, a calibration method of a coating system includes raising tips of a plurality of supporting pins of the coating system to a support position; disposing a calibrating disk on the supporting pins; retrieving the tips of the supporting pins to a retrieve position located under a suction plane and disposing the calibrating disk on a suction plane; vacuuming the calibrating disk with the suction plane and output a vacuum value; and comparing a vacuum value with a predetermined range.

In an embodiment of the present disclosure, the calibration method further includes: recalibrating the support position of the supporting pins or the position of the suction plane while the vacuum value is less than the predetermined value.

In an embodiment of the present disclosure, the supporting pins support a round plane of the calibrating disk, and a dependable wall of the calibrating disk limits horizontal movement of the supporting pins on a round bottom surface of the calibrating disk while the calibrating disk is disposed on the supporting pins, and the suction plane is configured to vacuum the round plane surrounded by the dependable wall.

In the aforementioned embodiments of the present disclosure, the coating system includes the calibrating disk being able to simulate the location of a wafer during the coating process of the coating system, and the calibration method of the coating system utilizes the calibrating disk can ensure the supporting pins and the suction plane are at a proper position, without damaging any wafer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
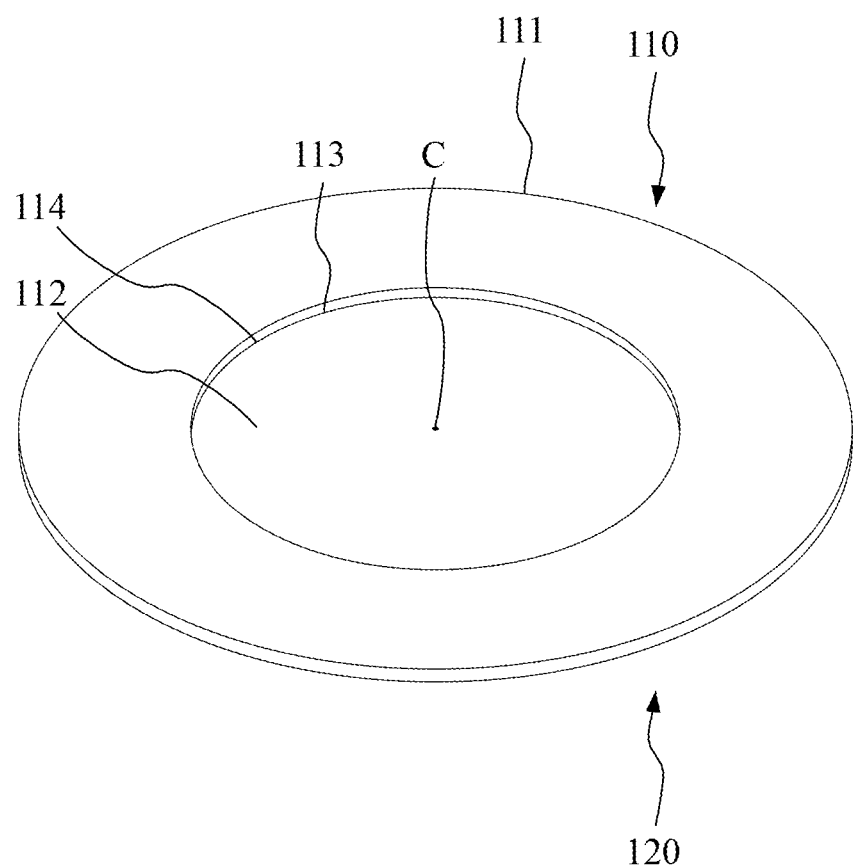
FIG. 1 is a schematic perspective view of a calibrating disk according to an embodiment of the present disclosure.

The present disclosure relates to an improvement in coating system and the calibration method thereof. The following description is presented to enable one of ordinary skill in the art to make and use the disclosure as provided in the context of a particular application and its requirements. Various modifications to the preferred embodiment will be apparent to those with skill in the art, and the general principles defined herein may be applied to other embodiments. Therefore, the present disclosure is not intended to be limited to the particular embodiments shown and described, but is to be accorded the widest scope consistent with the principles and novel features herein disclosed.

In the figures, the thickness of layers, films, panels, regions, etc., are exaggerated for clarity. Throughout the specification, the same reference numerals denote the same component. It will be understood that when an component such as a layer, a film, a region or a substrate is referred to as "on" or "connected to" another component, intermediate components can also be present. In contrast, when a component is referred to as "directly on" or "directly connected to" another component, no intermediate component can be present. As used herein, "connected" may refer to both physical and/or electrical connections. Furthermore, "electrical connection" or "coupled" may be the presence of other components between two elements.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Reference will now be made in detail to the present embodiments of the invention, examples of which are illustrated in the accompanying drawings. Wherever possible, the same reference numbers are used in the drawings and the description to refer to the same or like parts.

Figure 2:
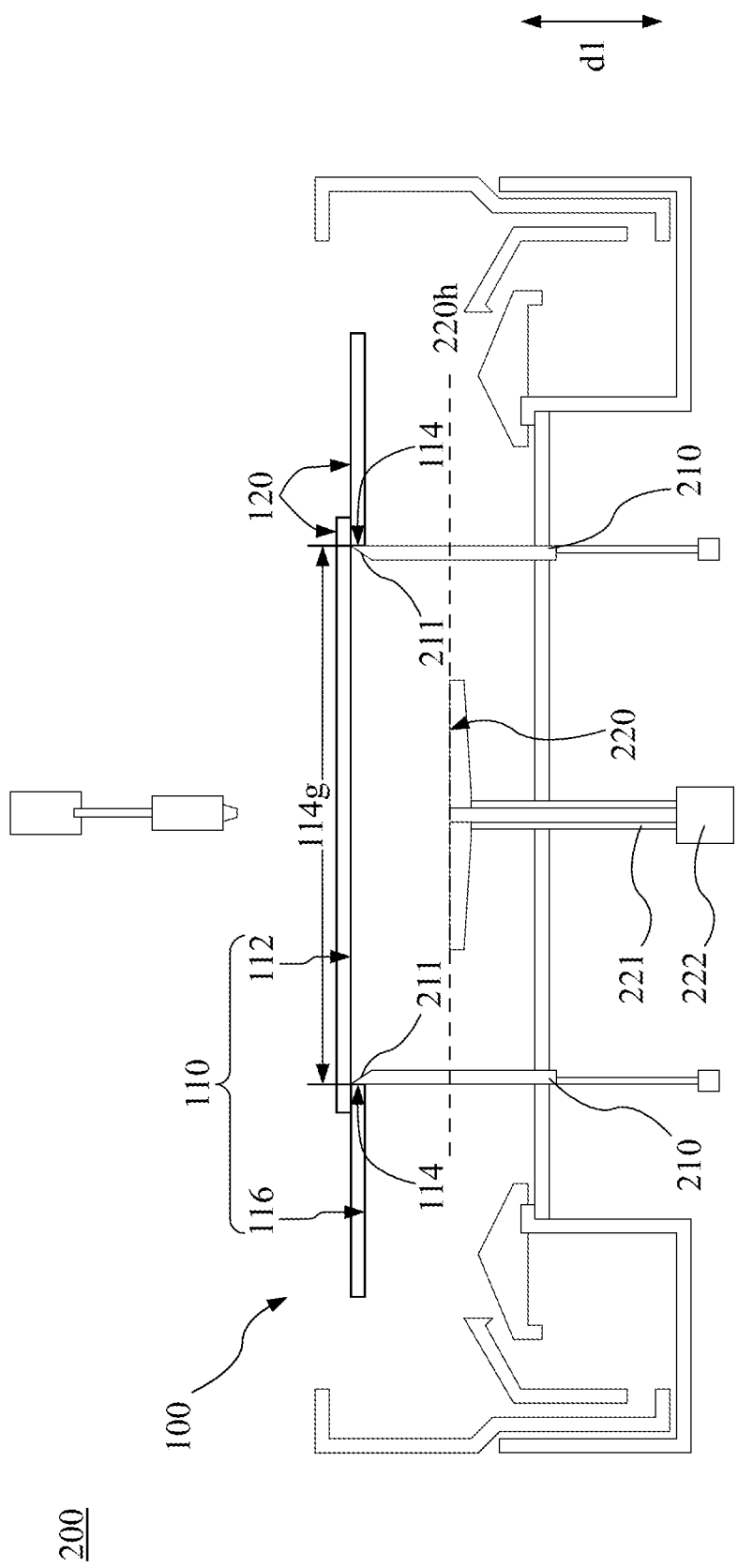
FIG. 2 is a schematic sectional view of a coating system according to the embodiment of the present disclosure.
Figure 3:
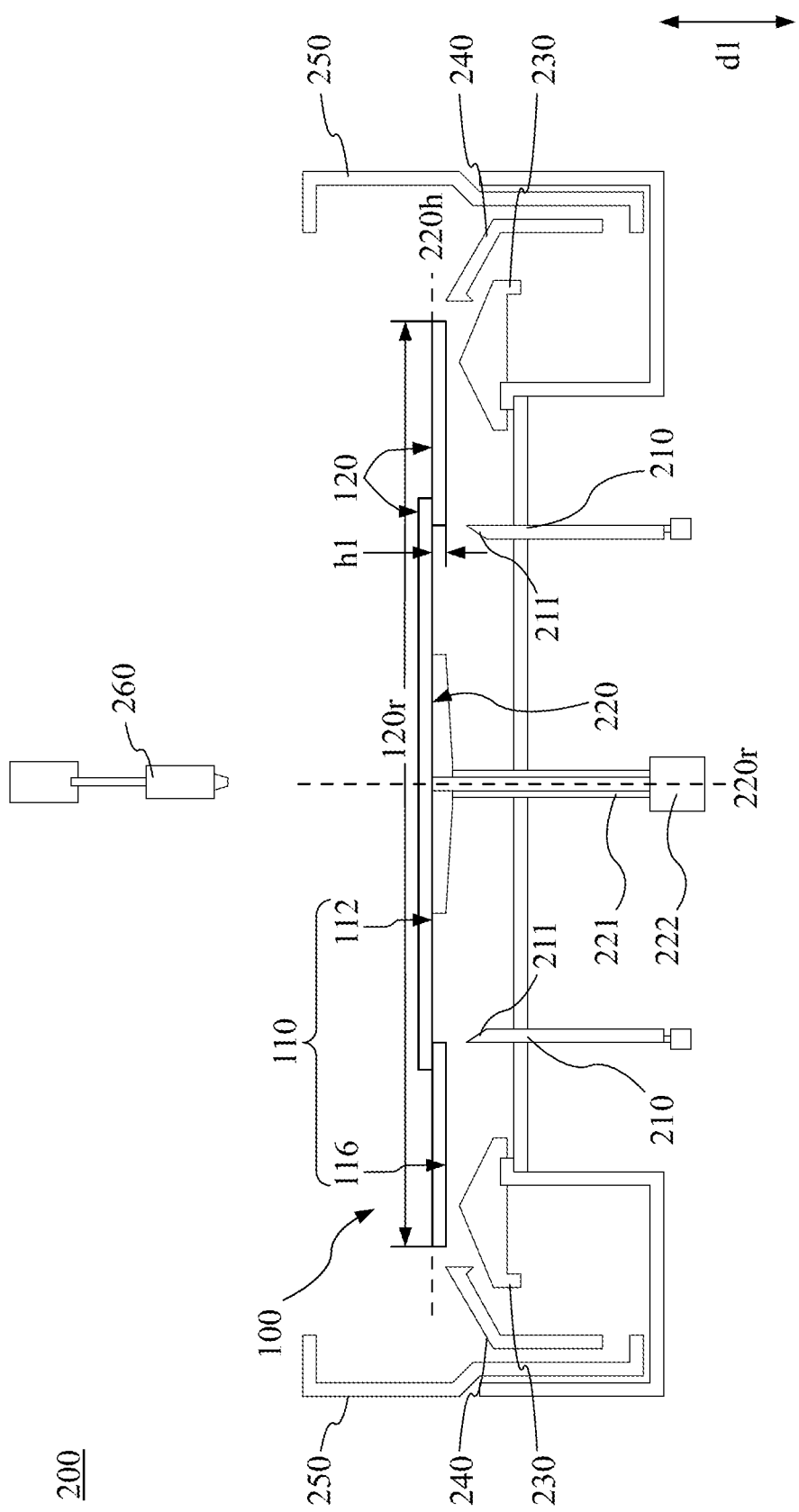
FIG. 3 is another schematic sectional view of the coating system according to the embodiment of the present disclosure.

FIG. 1 is a schematic perspective view of a calibrating disk according to an embodiment of the present disclosure, and FIG. 1 shows the perspective of a bottom view of the calibrating disk. FIG. 2 and FIG. 3 are schematic sectional views of a coating system according to the embodiment of the present disclosure. Referring to FIG. 1, in the embodiment of the present disclosure, the calibrating disk 100 includes a round bottom surface 110 and a round top surface 120 being opposite to the round bottom surface 110. The round bottom surface 110 of the calibrating disk 100 has a round plane 112 and a dependable wall 114 surrounding the round plane 112.

In the embodiment, the round plane 112 is flat, and edge 113 of the round plane 112 has a circular shape, and edge 111 of the round bottom surface 110 also has a circular shape. The edge 113 of the round plane 112 and the edge 111 of the round bottom surface 110 are concentric. In other words, the edge 113 of the round plane 112 and the edge 111 of the round bottom surface 110 share the same central C.

Material of the calibrating disk 100 of the embodiment may include glass, but the disclosure is not limited thereof. In other embodiment, the material of the calibrating disk 100 may include metal such as stainless steel or any other material that's able to provide a rigid flat surface and a rigid dependable structure through cutting or milling.

Referring to FIG. 2, coating system 200 of the embodiment includes supporting pins 210, and a suction plane 220. The suction plane 220 is located between the supporting pins 210, and the calibrating disk 100 is configured to dispose on the supporting pins 210 or the suction plane 220. To be specific, horizontal distribution of the suction plane 220 is located between the horizontal distributions of the supporting pins 210.

The dependable wall 114 of the calibrating disk 100 surrounds an accommodation space having a gap 114g, which is able to fit all the supporting pins 210, and, therefore, the dependable wall 114 of the calibrating disk 100 is able to limit horizontal movement of the supporting pins 210 while the calibrating disk 100 is disposed on the supporting pins 210.

For example, the diameter of the round plane 112 of the calibrating disk 100 and the maximum gap 114g between the dependable wall 114 of the embodiment are the same, and the diameter of the round plane 112 is in a range from 170 mm to 180 mm, which provide a proper rigid plane being able to fit the supporting pins 210.

Referring to FIG. 3, the calibrating disk 100 can also be disposed on the suction plane 220. The round plane 112 of the calibrating disk 100 is flat and providing a rigid area to cover the suction plane 220. The suction plane 220 is located between the supporting pins 210, which can fit in the accommodation space surrounded by the dependable wall 114, so the round plane 112 can cover the suction plane 220. Therefore, the suction plane 220 can create a partial vacuum in area between the suction plane 220 and the round plane 112.

The calibrating disk 100 of the embodiment is able to locate on both the supporting pins 210 and the suction plane 220, and, therefore, being able to perform a simulation testing positions of the supporting pins 210 and the suction plane 220 while holding the calibrating disk 100, so as to provide a proper support for a wafer during a coating process.

To be more specific, the round bottom surface 110 of the calibrating disk 100 includes a bottom ring-shaped plane 116 surrounding the round plane 112, and the round plane 112 is located downward from the bottom ring-shaped plane 116, and the dependable wall 114 connect the round plane 112 to the bottom ring-shaped plane 116.

For example, the depth h1 of the round plane 112 is in a range from 1 mm to 2 mm from the bottom ring-shaped plane 116, but the disclosure is not limited thereof.

Moreover, referring to FIG. 3, the supporting pins 210 of this embodiment are configure to move along a direction d1, which is substantially parallel to normal of the suction plane 220. Tips 211 of the supporting pins 210 of the embodiment can move to a support position above the suction plane 220. In other words, the suction plane 220 is located at a horizontal level 220h, and the supporting pins 210 are protruding from the horizontal level 220h while the tips 211 are moved to the support position. When the tips 211 are at the support position, the calibrating disk 100 can be disposed on the tips 211 of the supporting pins 210, without touching the suction plane 220, as shown in FIG. 2.

The dependable wall 114 surrounding the round plane 112 is able to limit the horizontal movement of the supporting pins 210 while the calibrating disk 100 is disposed on the supporting pins 210. To be specific, while the supporting pins 210 supports the calibrating disk 100 through holding the round plane 112 with the tips 211, the dependable wall 114 limits the movement of the tips 211 along the horizontal level 220h.

Referring to FIG. 3, the tips 211 of the supporting pins 210 of this embodiment can also move to a retrieve position, which is located under the suction plane 220. In other words, the tips 211 of the supporting pins 210 are located under the horizontal level 220h where the suction plane 220 is located, and the suction plane 220 can be covered by the round plane 112 of the calibrating disk 100, as shown in FIG. 3.

For example, the suction plane 220 is adapted to attract the round plane 112 of the calibrating disk 100 or a back surface of a wafer by suction and holds the wafer in a horizontal position while the tips 211 of the supporting pins 210 are at the retrieve position, and the back surface of the wafer can be support by the supporting pins 210 while the tips 211 of the supporting pins 210 are at the supporting position.

As mentioned above, the calibrating method of the embodiment includes following steps:
raising the tips 211 of the supporting pins 210 of the coating system 200 to a support position;
disposing the calibrating disk 100 on the supporting pins 210;
retrieving the tips 211 of the supporting pins 210 to a retrieve position located under the suction plane 220 and disposing the calibrating disk 100 on the suction plane 220;
vacuuming the calibrating disk 100 with the suction plane 220 and output a vacuum value; and
comparing the vacuum value with a predetermined range.

Referring to FIG. 3, by comparing the vacuum value with the predetermined range, the coating system 200 of the embodiment can ensure the suction plane 220 is properly covered by with the round plane 112 of the calibrating disk 100, and the calibrating disk 100 or a wafer will not be tilt or scratch by other device in the coating system 200 such as ring 230, inner cup 240, and outer cup 250 of the coating system 200.

To be specific, the suction plane 220 is able to rotate the calibrating disk 100 or the wafer thereon along rotation axis 220r with shaft 221 and driving unit 222, and the ring 230, the inner cup 240, and the outer cup 250 are able to catch photoresist compound being injected by the pouring nozzle 260 during a wafer coating process on the suction plane 220.

For example, the suction plane 220 is connected to the driving unit 222 by shaft 221, and the driving unit 222 drives the suction plane 220 holding a wafer or the calibrating disk 100 thereon for rotation or vertical movement. The inner cup 240 and the outer cup 250 surrounds the wafer or the calibrating disk 100 hold by the suction plane 220, being able to raise and catch cleaning liquid or photoresist compound on the wafer performing a high speed rotation.

With the calibration method of the embodiment using the calibrating disk 100, a wafer on the suction plane 220 do not contact with the ring 230, the inner cup 240, or the outer cup 250, and the coating system 200 can avoid scratching on the wafer during the movement and the rotation.

In other words, the coating system 200 of the embodiment is adapted to disposed a wafer on the supporting pins 210 or the suction plane 220, in which diameters of the wafer is same as the diameter 120r of the round top surface 120, and, therefore, the coating system 200 can provide a proper simulation of a coating process of a wafer with the calibrating disk 100.

For example, the diameter 120r of the round top surface 120 of the calibrating disk 100 of the embodiment is in a range from 298 mm to 300 mm, so as to provide a proper simulation of a 12-inch (300 mm) silicon wafer being disposed on the supporting pins 210 or the suction plane 220 during a coating process of the coating system 200.

On the other hands, referring to FIG. 3, calibration method of the embodiment can further perform a recalibration to the support position of the supporting pins 210 or the position of the suction plane 220 while the vacuum value is not in the predetermined range, which indicates that the calibrating disk 100 is not disposed properly on the suction plane 220 while the tips 211 of the supporting pins 210 is at the retrieve position.

Also, in the embodiment, the calibration method can also include step of recalibrating positions of the ring 230, the inner cup 240, or the outer cup 250, and the disclosure is not limited thereof.

Figure 4:
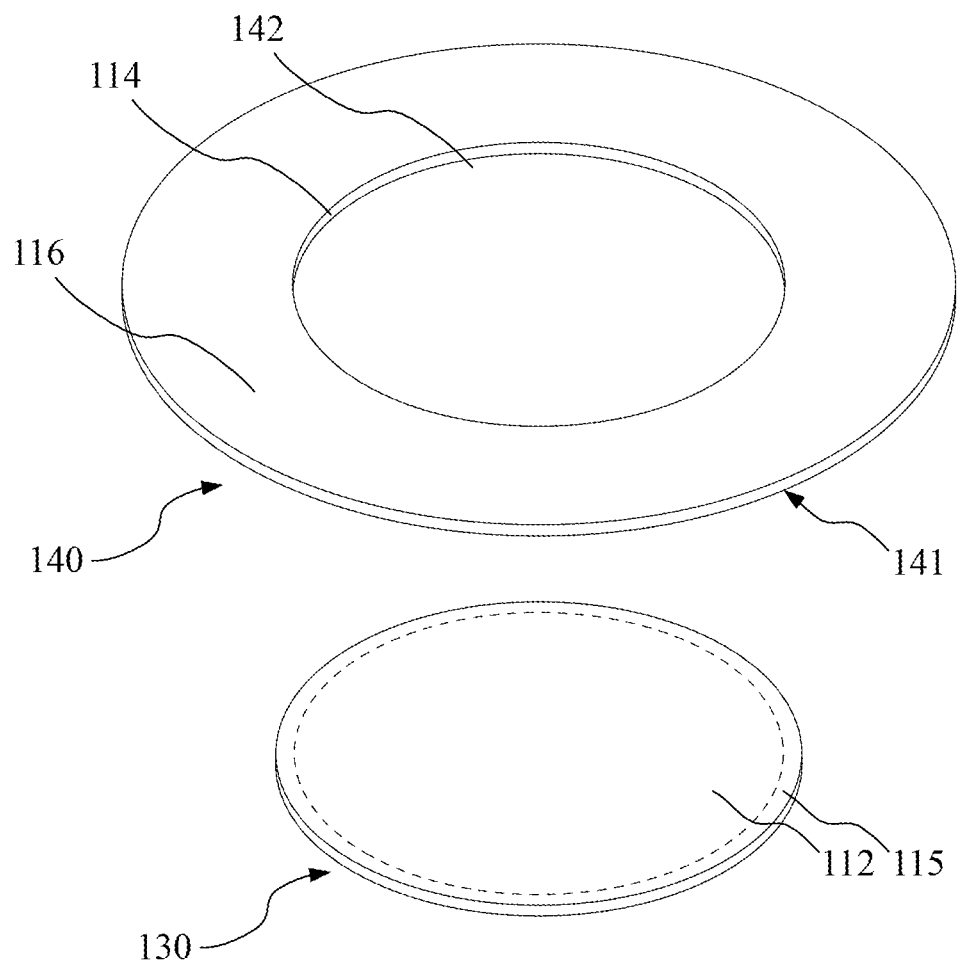
FIG. 4 is a schematic perspective exploded view of the calibrating disk according to the embodiment of the present disclosure.

FIG. 4 is a schematic perspective exploded view of the calibrating disk 100 according to the embodiment. Referring to FIG. 4, the calibrating disk 100 includes a round substrate 130 and a donut substrate 140. The round substrate 130 has the round plane 112, and the donut substrate 140 has a top ring-shaped plane 141, a bottom ring-shaped plane 116, and a central hole 142. The round substrate 130 is connected to the top ring-shaped plane 141 of the donut substrate 140 and covering opening of the central hole 142 on the top ring-shaped plane 141, and the round plane 112 is located downward from the bottom ring-shaped plane 116 and being accessible through the central hole 142. In other words, the round substrate 130 is connected to the donut substrate 140 through a connecting plane 115 surrounding the round plane 112, and the round plane 112 will be exposed by the central hole 142 after connection. Therefore, the calibrating disk 100 of the embodiment can be fabricated through the combination of the round substrate 130 and the donut substrate 140.

Figure 5:
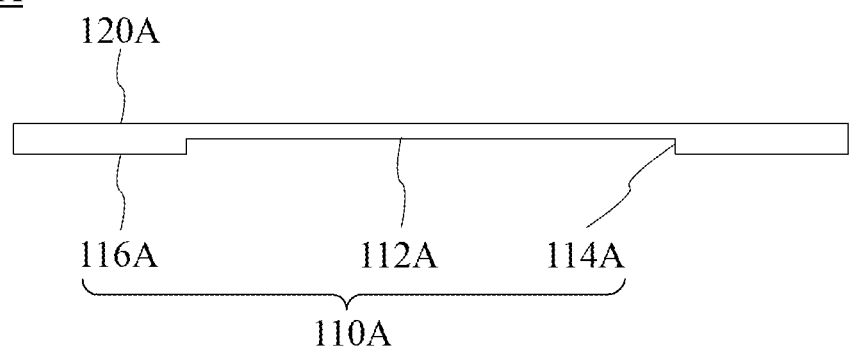
FIG. 5 is a schematic sectional view of a calibrating disk according to another embodiment of the present disclosure.

FIG. 5 is a schematic sectional view of a calibrating disk according to another embodiment of the present disclosure. Referring to FIG. 5, the calibrating disk 100A has a round top surface 120A and a round bottom surface 110A being opposite to the round top surface 120A, and round plane 112A of the round bottom surface 110A is located downward from bottom ring-shaped plane 116A. Moreover, material of the calibrating disk 100A includes metal such as stainless steel, and the round plane 112A can be fabricated through milling machine, and the coating system 200 of the above embodiment can perform the calibration method above through the calibrating disk 100A.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A coating system, comprising:
   a plurality of supporting pins;
   a suction plane located between the supporting pins; and
   a calibrating disk being configured to dispose on the supporting pins or the suction plane, wherein the calibrating disk comprises:
   a round top surface; and
   a round bottom surface being opposite to the round top surface, wherein the round bottom surface has a round plane and a dependable wall surrounding the round plane, and an edge of the round plane and an edge of the round bottom surface are concentric, and the dependable wall is configured to limited horizontal movement of the supporting pins, and the round plane is configured to cover the suction plane.

2. The coating system of claim 1, wherein the supporting pins have tips, and the tips of the supporting pins are configured to move between a support position and a retrieve position, and the support position is located above the suction plane, and the retrieve position is located under the suction plane.

3. The coating system of claim 1, wherein the supporting pins and the suction plane are configured to hold a wafer, and a diameter of the wafer and a diameter of the edge of the round top surface are the same.

4. The coating system of claim 1, wherein a diameter of the round top surface is in a range from 298 mm to 300 mm.

5. The coating system of claim 1, wherein a diameter of the round plane is in a range from 170 mm to 180 mm.

6. The coating system of claim 1, wherein a material of the calibrating disk includes glass or metal.

7. The coating system of claim 1, wherein the round bottom surface includes a bottom ring-shaped plane surrounding the round plane, and the round plane is located downward from the bottom ring-shaped plane, and the dependable wall connects the round plane to the bottom ring-shaped plane.

8. The coating system of claim 7, wherein a depth of the round plane is in a range from 1 mm to 2 mm from the bottom ring-shaped plane.

9. The coating system of claim 7, wherein the calibrating disk further includes:
   a round substrate having the round plane; and
   a donut substrate having a top ring-shaped plane, a bottom ring-shaped plane being opposite to the top ring-shaped plane, and a central hole,
   and the round substrate is connected to the top ring-shaped plane of the donut substrate and covering opening of the central hole on the top ring-shaped plane, and the round plane is located downward from the bottom ring-shaped plane and being accessible through the central hole.

10. A calibration method of a coating system, comprising:
    raising tips of a plurality of supporting pins of the coating system to a support position;
    disposing a calibrating disk on the supporting pins;
    retrieving the tips of the supporting pins to a retrieve position located under a suction plane and disposing the calibrating disk on a suction plane;
    vacuuming the calibrating disk with the suction plane and output a vacuum value; and
    comparing the vacuum value with a predetermined range.

11. The calibration method of claim 10, further including:
    recalibrating the support position, the retrieve position of the supporting pins or position of the suction plane while the vacuum value is not in the predetermined range.

12. The calibration method of claim 10, wherein the supporting pins support a round plane of the calibrating disk, and a dependable wall of the calibrating disk limits horizontal movement of the supporting pins on a round bottom surface of the calibrating disk while the calibrating disk is disposed on the supporting pins, and the suction plane is configured to vacuum the round plane surrounded by the dependable wall.

* * * * *